(12) United States Patent
Hayashi

(10) Patent No.: US 11,361,949 B2
(45) Date of Patent: Jun. 14, 2022

(54) SUBSTRATE PLACING TABLE, PLASMA PROCESSING APPARATUS PROVIDED WITH SAME, AND PLASMA PROCESSING METHOD

(71) Applicant: SPP TECHNOLOGIES CO., LTD., Tokyo (JP)

(72) Inventor: Yasuyuki Hayashi, Hyogo (JP)

(73) Assignee: SPP TECHNOLOGIES CO., LTD., Tokyo (JP)

( * ) Notice: Subject to any disclaimer, the term of this patent is extended or adjusted under 35 U.S.C. 154(b) by 167 days.

(21) Appl. No.: 16/613,975

(22) PCT Filed: Jan. 9, 2019

(86) PCT No.: PCT/JP2019/000283
§ 371 (c)(1),
(2) Date: Nov. 15, 2019

(87) PCT Pub. No.: WO2019/155808
PCT Pub. Date: Aug. 15, 2019

(65) Prior Publication Data
US 2021/0265141 A1      Aug. 26, 2021

(30) Foreign Application Priority Data

Feb. 8, 2018   (JP) .............................. JP2018-021302

(51) Int. Cl.
*H01L 21/683*     (2006.01)
*H01J 37/32*      (2006.01)
(Continued)

(52) U.S. Cl.
CPC .. *H01J 37/32724* (2013.01); *H01J 37/32642* (2013.01); *H01L 21/67069* (2013.01);
(Continued)

(58) Field of Classification Search
CPC ........... H01J 37/32724; H01J 37/32642; H01J 2237/2007; H01J 2237/334;
(Continued)

(56) References Cited

U.S. PATENT DOCUMENTS 5,584,971 A  * 12/1996  Komino ................. C23C 14/541
                                                        204/192.13
2014/0069585 A1* 3/2014  Aoto .................. H01J 37/32807
                                                        156/345.52
(Continued)

FOREIGN PATENT DOCUMENTS

JP        2001068538 A      3/2001
JP        2006237348 A      9/2006
(Continued)

OTHER PUBLICATIONS

Search Report for related European Application No. 19751281.7; report dated Dec. 1, 2020.
(Continued)

*Primary Examiner* — Lan Vinh
(74) *Attorney, Agent, or Firm* — von Briesen & Roper, s.c.

(57) ABSTRACT

Provided is a substrate placing table (15) capable of reducing influences of external factors such as the temperature inside a chamber (11). The substrate placing table (15) disposed in the chamber (11) in a plasma processing apparatus (1) includes an electrostatic chuck (61) and a cooling jacket (62), and the electrostatic chuck (61) consists of an upper disk part (61*a*) having an electrode (71) for electrostatic attraction incorporated therein, and a lower disk part (61*b*) having a greater diameter than the upper disk part (61*a*) and having a heater (72) incorporated therein. A focus ring (64) disposed outside the upper disk part (61*a*) in a radial direction of the upper disk part (61*a*) and covering an upper surface of the lower disk part (61*b*), an upper annular
(Continued)

cover (65) for thermal insulation enclosing the lower disk part (61b) and at least a part of the cooling jacket (62), and a lower annular cover (66) for thermal insulation clamping the cooling jacket (62) between itself and the upper annular cover (65) are made of ceramics.

6 Claims, 5 Drawing Sheets

(51) Int. Cl.
  *H01L 21/67* (2006.01)
  *H01L 21/687* (2006.01)
(52) U.S. Cl.
  CPC .... *H01L 21/67103* (2013.01); *H01L 21/6833* (2013.01); *H01L 21/68721* (2013.01); *H01J 2237/002* (2013.01); *H01J 2237/2007* (2013.01); *H01J 2237/334* (2013.01)
(58) Field of Classification Search
  CPC ......... H01J 2237/002; H01L 21/67103; H01L 21/6833; H01L 21/67069; H01L 21/68721; H01L 21/205; H01L 21/67109; H01L 21/6831
  USPC .............. 156/345.3, 345.37, 345.51, 345.52, 156/345.53; 438/706, 714, 715
  See application file for complete search history.

(56) References Cited

U.S. PATENT DOCUMENTS

| | | | |
|---|---|---|---|
| 2014/0209245 | A1 | 7/2014 | Yamamoto et al. |
| 2015/0279714 | A1* | 10/2015 | Yamaguchi ......... H01L 21/6833 |
| | | | 279/128 |
| 2016/0104634 | A1 | 4/2016 | Lee |
| 2017/0133245 | A1 | 5/2017 | Ilzuka |
| 2017/0260616 | A1* | 9/2017 | Lee ........................... C23C 4/04 |
| 2017/0358475 | A1 | 12/2017 | Kwon et al. |
| 2018/0103508 | A1* | 4/2018 | Matyushkin ........ H01L 21/6831 |

FOREIGN PATENT DOCUMENTS

| | | |
|---|---|---|
| JP | 2010123809 A | 6/2010 |
| JP | 2013172013 A | 9/2013 |
| JP | 2017174889 A | 9/2017 |
| TW | 508717 B | 11/2002 |
| WO | 2018044192 A1 | 3/2018 |

OTHER PUBLICATIONS

International Search Report for related International Application No. PCT/JP2019/000283 ; report dated Feb. 26, 2019.

Taiwanese Office Action related to Application No. 108101690; dated Feb. 7, 2022.

* cited by examiner

SUBSTRATE PLACING TABLE, PLASMA PROCESSING APPARATUS PROVIDED WITH SAME, AND PLASMA PROCESSING METHOD

TECHNICAL FIELD

The present invention relates to a substrate placing table on which a substrate, for example, a wafer for a semiconductor, is placed in an electrostatically attracted manner so as to be subjected to plasma etching or the like in a chamber, and also relates to a plasma processing apparatus provided with such a substrate placing table, and a plasma processing method.

BACKGROUND ART

A known plasma processing apparatus is configured such that a substrate for a semiconductor, as a workpiece to be processed, is placed on a substrate placing table disposed in a chamber, plasma is generated from a predetermined processing gas supplied into the chamber, and the substrate is etched by the plasma generated from the processing gas. Further, a substrate processing table suitable for plasma processing has been developed which includes an electrostatic chuck having incorporated therein an electrode for electrostatic attraction and a heater for heating the substrate, and a cooling jacket disposed under the electrostatic chuck (Patent Literatures 1 and 2). The substrate placing table of this type is configured such that a voltage is applied to the electrode for electrostatic attraction to induce dielectric polarization in a dielectric layer between the electrode surface and the upper-end chuck surface of the electrostatic chuck, and the substrate is attracted to and held on the chuck surface by an electrostatic force generated between the substrate and the chuck surface. During processing, the substrate is subjected to etching or the like with the substrate maintained at a predetermined temperature by temperature control using the heater and the cooling jacket.

CITATION LIST

Patent Literature

[Patent Literature 1] Japanese Unexamined Patent Application Publication No. 2001-68538
[Patent Literature 2] Japanese Unexamined Patent Application Publication No. 2006-237348

SUMMARY OF INVENTION

Technical Problem

However, temperature control of the electrostatic chuck and the substrate by means of the heater and the cooling jacket has the problem that influences of the environment around the substrate placing table, such as the temperature inside the chamber, complicate appropriate temperature control of the electrostatic chuck and the substrate. For example, during initial temperature increasing and predetermined-temperature idling, during which the substrate placing table is in a non-processing mode with no substrate placed thereon, a large amount of heat is released from the heated electrostatic chuck to the outside through the cooling jacket disposed under the electrostatic chuck. Therefore, a heater of large capacity is required which is a cause of wasteful power consumption. On the other hand, during processing, during which etching or the like is performed with a substrate placed on the substrate placing table, a large amount of heat is continuously transferred from the heated substrate to the electrostatic chuck; therefore, it is required to remove a large amount of heat. Specifically, during steps of increasing the temperature of the electrostatic chuck and idling at a predetermined temperature, e.g., 200° C., (constant-temperature step) in the non-processing mode, it is necessary to prevent heat generated by the heater from being released to the outside so as to efficiently increase the temperature of the electrostatic chuck or maintain a constant temperature of the electrostatic chuck. On the other hand, during processing of the substrate, for example, plasma etching of the substrate, it is necessary to efficiently remove heat from the substrate through the electrostatic chuck so as to prevent the substrate from reaching a higher temperature than necessary.

The present invention has been achieved in view of the above-described circumstances, and an object thereof is to provide a substrate placing table which is capable of reducing influences of external factors, such as chamber inside temperature, on an electrostatic chuck and a cooling jacket, thereby facilitating temperature control of a substrate and the electrostatic chuck, and also provide a plasma processing apparatus provided with such a substrate placing table, and a plasma processing method.

Solution to Problem

The present invention, for accomplishing the above-mentioned object, relates to a substrate placing table electrostatically attracting a substrate to be processed, including:
an electrostatic chuck consisting of an upper disk part and a lower disk part disposed under the upper disk part, the upper disk part having incorporated therein an electrode electrostatically attracting the substrate, the lower disk part having a greater diameter than the upper disk part and having a heater incorporated therein;
a cooling jacket disposed under the lower disk part and cooling the electrostatic chuck;
a focus ring disposed outside the upper disk part in a radial direction of the upper disk part and covering an upper surface of the lower disk part;
an upper annular cover for thermal insulation enclosing the lower disk part and at least a part of the cooling jacket; and
a lower annular cover for thermal insulation clamping the cooling jacket between itself and the upper annular cover, the focus ring, the upper annular cover, and the lower annular cover being made of ceramics.

This substrate placing table is capable of reducing external influences on the electrostatic chuck and the cooling jacket since the focus ring and the outer and lower annular covers for thermal insulation, which cover the top and radial outer side of the electrostatic chuck and cooling jacket, are made of ceramics. This enables efficient temperature control of the electrostatic chuck and the substrate.

It is preferred that the substrate placing table is configured such that an area where the heater is disposed has a diameter greater than a diameter of the substrate.

With the thus-configured substrate placing table, since the area where the heater is disposed is set to have a diameter greater than the diameter of the substrate, temperature distribution on the electrostatic chuck is made uniform from the center to the outer peripheral edge of the substrate.

Further, it is preferred that the substrate placing table is configured such that:

the cooling jacket has an outward flange portion integrally formed on a radial outer peripheral surface thereof; and the outward flange portion is clamped from above and below by the upper annular cover and the lower annular cover.

With the thus-configured substrate placing table, since the outward flange portion of the cooling jacket is clamped between the upper and lower annular covers that are made of ceramics, the upper and lower annular covers not only serve to provide thermal insulation for the electrostatic chuck and the cooling jacket but also serve to hold the cooling jacket.

Further, it is preferred that the substrate placing table is configured such that:

a minute clearance is formed between the electrostatic chuck and the cooling jacket, which extends throughout the area where the heater is disposed and which is sealed from outside; and the minute clearance is switchably connected to a helium gas supply and a vacuum pump so that it is switchable between a helium-gas filled state and a vacuum state.

In the thus-configured substrate placing table, the minute clearance is brought into the vacuum state at the times of initial temperature increasing and constant-temperature idling, during which the substrate placing table is in a non-processing mode. Thereby, loss of heat from the electrostatic chuck to the cooling jacket disposed under the electrostatic chuck is prevented; therefore, the initial temperature increasing is efficiently performed and the idling is maintained at a predetermined temperature. On the other hand, at the time of plasma processing, the minute clearance is brought into the helium-gas filled state. Thereby, heat of the heated substrate is quickly released to the cooling jacket through helium gas that has excellent heat transfer properties; therefore, the heat is efficiently removed.

Furthermore, it is preferred that the electrostatic chuck of the substrate placing table is made of aluminum nitride.

With such a substrate placing table, since aluminum nitride that has high thermal conductivity is used as the electrostatic chuck, as compared with the case of using aluminum oxide, better temperature distribution is provided which prevents the electrostatic chuck from cracking due to thermal stress.

The present invention further provides a plasma processing apparatus having the above-described substrate placing table incorporated in a chamber thereof.

With such a plasma processing apparatus, since the apparatus has the above-described substrate placing table that facilitates temperature control of the substrate and the electrostatic chuck, temperature management during processing of the substrate is facilitated. Therefore, a non-uniform processing result with poor reproducibility which is caused by unstable or non-uniform wafer temperature is prevented.

The present invention further provides a substrate processing method, wherein the above-described substrate placing table having the minute clearance between the substrate placing table and the cooling jacket is used, and the minute clearance is brought into the vacuum state at the times of initial temperature increasing and idling, during which the substrate placing table is in the non-processing mode, and the minute clearance is brought into the helium-gas filled state at the time of processing of the substrate.

With this method, when the substrate placing table is in the non-processing mode, loss of heat from the electrostatic chuck to the cooling jacket disposed under the electrostatic chuck is prevented; therefore, the initial temperature increasing is efficiently performed and the idling is maintained at a predetermined temperature. On the other hand, during processing of the substrate, heat of the heated substrate is quickly released to the cooling jacket through helium gas that has excellent heat transfer properties; therefore, the heat is efficiently removed.

Advantageous Effects of Invention

As described above, the substrate placing table and substrate processing method according to the present invention are capable of reducing influences of external factors, such as chamber inside temperature, on the electrostatic chuck and the cooling jacket, thereby facilitating temperature control of the substrate and the electrostatic chuck. Further, the plasma processing apparatus according to the present invention is capable of preventing a non-uniform processing result with poor reproducibility which is caused by unstable or non-uniform wafer temperature.

DESCRIPTION OF EMBODIMENTS

Hereinafter, an embodiment of the present invention will be described with reference to the drawings.

Embodiment

Figure 1:
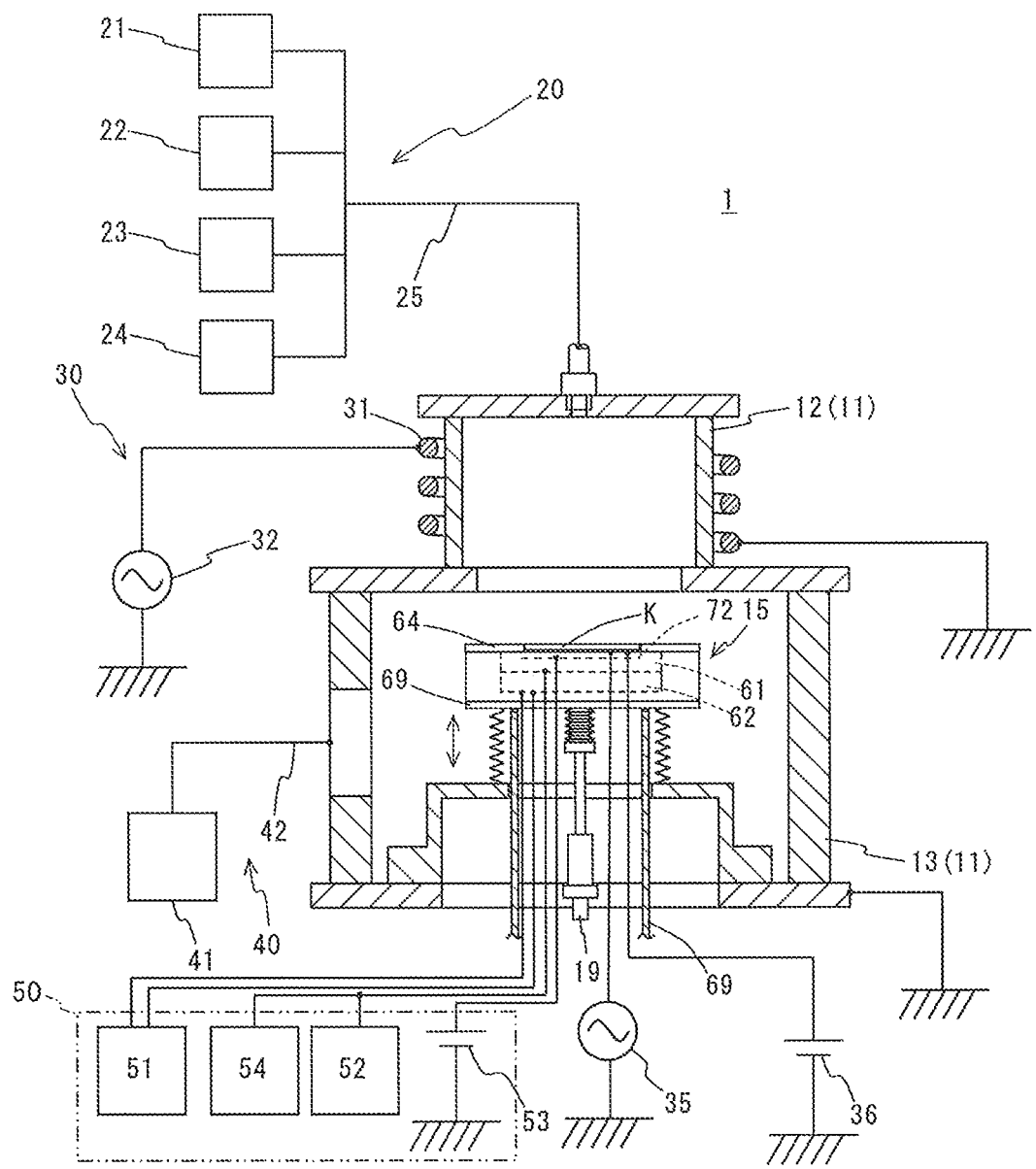
FIG. 1 is vertical sectional view of a schematic configuration of a plasma processing apparatus according to an embodiment of the present invention.

FIG. 1 is a vertical sectional view of a schematic configuration of a plasma processing apparatus 1 according to an embodiment of the present invention. The plasma processing apparatus 1 shown in FIG. 1 includes a chamber 11 having a closed space, a substrate placing table 15 which is disposed in the chamber 11 such that it can be lifted and lowered by a lifting cylinder (not shown) and on which a substrate K to be processed, such as a wafer, is to be placed, a lifting cylinder 19 disposed in the interior of the substrate placing table 15 to lift and lower a wafer lifter, a gas supply device 20 supplying an etching gas, a passivation-film forming gas, and an inert gas into the chamber 11, a plasma generating device 30 generating plasma from the etching gas, passivation-film forming gas, or inert gas supplied in the chamber 11, an exhaust device 40 reducing the pressure inside the chamber 11, an RF power supply unit 35 supplying an RF power for plasma processing to the substrate placing table 15, and a power supply unit 36 for electrostatic attraction applying a voltage for electrostatic attraction to the substrate placing table 15. The plasma processing apparatus 1 further includes a temperature adjustment system 50 consisting of devices for adjusting the temperature of the substrate placing table 15 and the temperature of the substrate K.

As shown in FIG. 1, the chamber 11 consists of an upper chamber 12 and a lower chamber 13 each having an interior space, the interior spaces of the upper and lower chambers 12 and 13 communicating with each other. The upper chamber 12 is formed to have an inner diameter smaller than that of the lower chamber 13. The upper chamber 12 is equipped with an upper-chamber heater (not shown) which is provided on the inner side of a top plate thereof, while the lower chamber is equipped with a lower-chamber heater which is provided in the form of a block heater on the inner side of a side wall thereof. The block heater is, for example, manufactured by incorporating a heating element into a block made of aluminum.

The gas supply device 20 includes an $SF_6$ gas supply unit 21 supplying $SF_6$ gas as an etching gas, an $SiF_4$ gas supply unit 22 supplying $SiF_4$ gas as a passivation-film forming gas, an $O_2$ gas supply unit 23 supplying $O_2$ gas as a passivation-film forming gas, an inert gas supply unit 24 supplying an inert gas, e.g., Ar gas. A gas supply pipe 25 is connected at one end thereof to an upper surface of the upper chamber 12, and is branched and connected at the other end thereof to the $SF_6$ gas supply unit 21, the $SiF_4$ gas supply unit 22, the $O_2$ gas supply unit 23, and the inert gas supply unit 24. The $SF_6$ gas supply unit 21, the $SiF_4$ gas supply unit 22, the $O_2$ gas supply unit 23, and the inert gas supply unit 24 respectively supply $SF_6$ gas, $SiF_4$ gas, $O_2$ gas, and an inert gas into the chamber 11 through the gas supply pipe 25. Note that, while this embodiment uses the aforementioned gases, various gases, such as HBr, $Cl_2$, $SF_6$, $O_2$, Ar, and $N_2$, can be used depending on the object to be etched.

The plasma generating device 30 generates inductively coupled plasma (ICP). The plasma generating device 30 consists of a spiral (annular) coil 31 disposed on the upper chamber 12, and an RF power supply unit 32 supplying an RF power to the coil 31. Once an RF power is supplied to the coil 31 by the RF power supply unit 32, plasma is generated from the $SF_6$ gas, $SiF_4$ gas, $O_2$ gas, or inert gas supplied in the upper chamber 12.

The RF power supply unit 35 connected to the substrate placing table 15 supplies an RF power to an electrostatic chuck 61 of the substrate placing table 15 to apply a bias potential between the electrostatic chuck 61 and the plasma. Thereby, ions generated by the generation of plasma from the $SF_6$ gas, $SiF_4$ gas, $O_2$ gas, or inert gas are made incident on the substrate K placed on the substrate placing table 15. Note that, while this embodiment uses $SF_6$ gas, $SiF_4$ gas, $O_2$ gas, etc. in generating plasma, various gases, such as, for example, HBr, $Cl_2$, $SF_6$, $O_2$, Ar, and $N_2$, can be used depending on the object to be etched.

The exhaust device 40 consists of a vacuum pump 41 exhausting the chamber 11 by sucking gas therein, and an exhaust pipe 42. The exhaust pipe 42 is connected at one end thereof to the vacuum pump 41, and is connected at the other end thereof to a side surface of the lower chamber 13. The vacuum pump 41 sucks gas out of the chamber 11 through the exhaust pipe 42, thereby bringing the interior of the chamber 11 into a vacuum state.

The temperature adjustment system 50 includes a heater power supply unit 53 supplying electric power to a heater 72 for heating provided in the interior of the substrate placing table 15, a chiller unit 51 supplying a coolant for cooling to the substrate placing table 15, a helium gas supply unit 52 supplying helium gas (hereinafter, referred to as "He gas"), which has excellent heat transfer properties, to the substrate placing table 15, and a vacuum pump 54 for forming a vacuum layer for thermal insulation (minute clearance 80 shown in FIG. 2 and described later) in the interior of the substrate placing table 15. The above-described vacuum pump 41 for the chamber can function as the vacuum pump 54.

Figure 2:
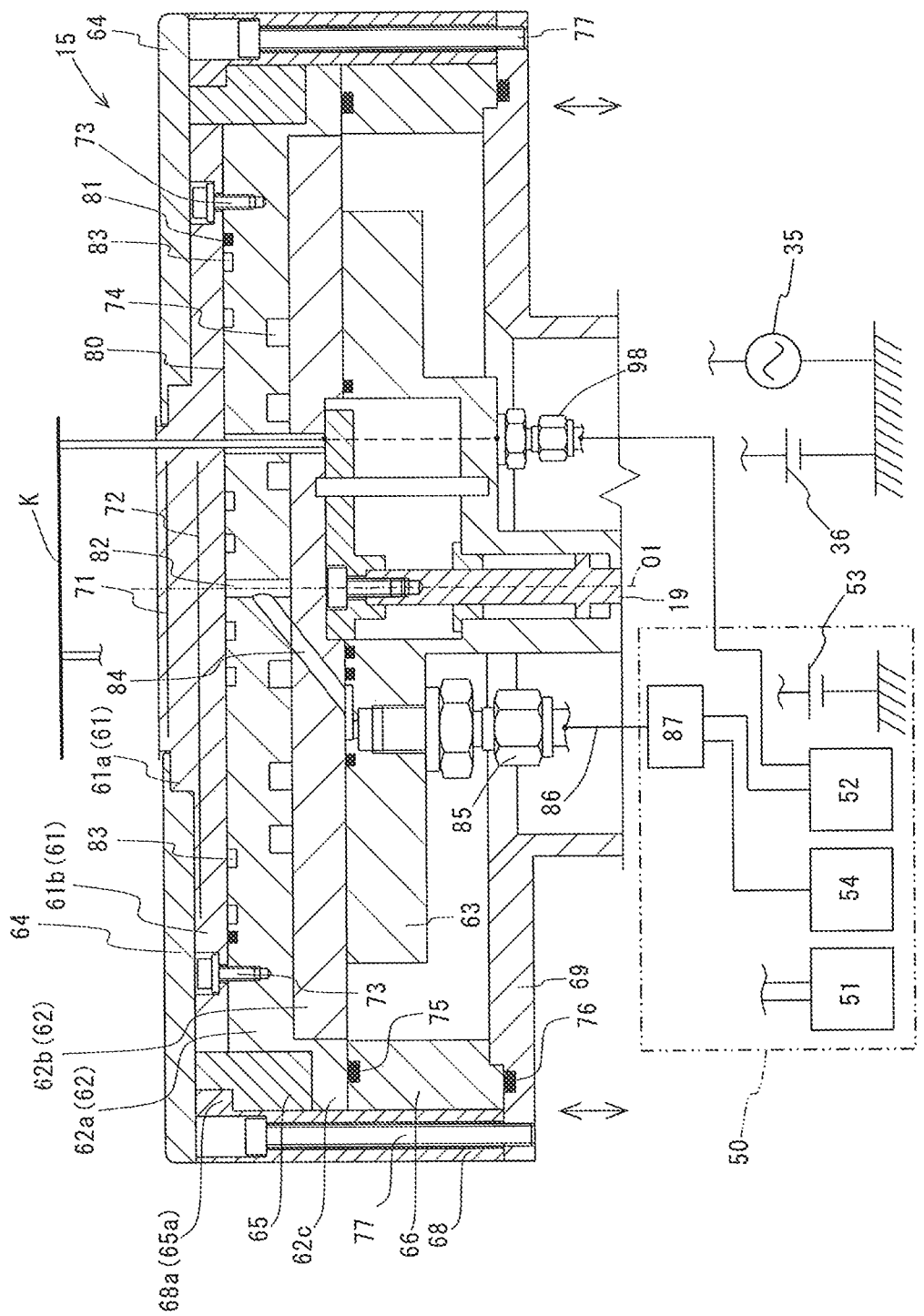
FIG. 2 is an enlarged vertical sectional view of a substrate placing table shown in FIG. 1.

FIG. 2 is an enlarged vertical sectional view of the substrate placing table 15 shown in FIG. 1. The substrate placing table 15 in FIG. 2 includes the electrostatic chuck 61 that is made of aluminum nitride, a cooling jacket 62 made of aluminum disposed under the electrostatic chuck 61, a bracket 63 coupled to the lower side of the cooling jacket 62 and forming a lifting space for the wafer lifter driven by the lifting cylinder 19, and a focus ring 64 disposed above the electrostatic chuck 61. The electrostatic chuck 61 consists of an upper disk part 61a having an electrode 71 for electrostatic attraction incorporated therein, and a lower disk part 61b having a greater diameter than the upper disk part 61a and having the heater 72 incorporated therein. Note that the upper disk part 61a and the lower disk part 61b are integrated to form the electrostatic chuck 61.

The substrate placing table 15 in FIG. 2 further includes an upper annular cover 65 for thermal insulation enclosing the lower disk part 61b and at least a part of the cooling jacket 62, a lower annular cover 66 for thermal insulation surrounding the radial outer side of the bracket 63, an outer case 68 surrounding the radial outer peripheries of the upper annular cover 65 and lower annular cover 66, and a table support 69 coupled to a lower surface of the outer case 68 and entirely supporting the substrate placing table 15. Note that the cooling jacket 62 is clamped by and between the upper annular cover 65 and the lower annular cover 66.

The electrode 71 for electrostatic attraction is connected to the power supply unit 36 for electrostatic attraction, and the heater 72 for heating is connected to the heater power supply unit 53 of the temperature adjustment system 50. The upper disk part 61a is formed to have substantially the same planar shape and area as those of the substrate K to be placed thereon. Once a voltage is applied to the electrode 71 for electrostatic attraction by the power supply unit 36 for electrostatic attraction, the substrate K is attracted to and held on an upper-end chuck surface of the upper disk part 61a due to electrostatic induction. The heater 72 for heating extends in the interior of the lower disk part 61b to an extent having a diameter greater than the diameter of the substrate K.

The cooling jacket 62 consists of a jacket body 62a on the upper side and a bottom part 62b on the lower side. The jacket body 62a is coupled to a lower surface of the electrostatic chuck 61 by a plurality of bolts 73. The bottom part 62b is fitted in a lower recess of the jacket body 62a and fixed to the jacket body 62a by means of welding or the like. A groove formed in a lower surface of the jacket body 62a and an upper surface of the bottom part 62b together form a coolant flow channel 74 for cooling. The plurality of bolts 73 are arranged on one circle centered at a table axis O1. The coolant flow channel 74 is formed to have, for example, a spiral shape in planar view, and is configured such that a coolant (Galden®) supplied from the chiller unit 51 flows into the coolant flow channel 74 through a connection port provided in a lower surface of the cooling jacket 62 and circulates through the coolant flow channel 74 to draw heat from the wafer, and then the coolant is returned to the chiller unit 51. The chiller unit 51 cools down the coolant and then sends the coolant to the coolant flow channel 74 again.

Herein, removal of heat means releasing heat of the wafer to the outside through the coolant and the surface of the bottom part 62b of the cooling jacket 61. Heat of the wafer is mostly released to the outside through the coolant and partially released through the surface of the bottom part 62b of the cooling jacket 61. Thereby, the temperature of the wafer itself is decreased. Note that the space surrounded by the bottom part 62b of the cooling jacket 62 and the table support 69 is at the atmospheric pressure. Note further that the coolant having been heated by drawing heat from the wafer is cooled down in the chiller unit 51.

The jacket body 62a has an outward flange portion 62c integrally formed on a lower end of the radial outer periphery thereof. This flange portion 62c is clamped from above and below by the upper and lower annular covers 65 and 66 for thermal insulation that are made of ceramics.

The upper annular cover 65 has an annular cutout 65a formed in an upper end thereof, and an inward flange portion 68a formed on the outer case 68 is engaged with the cutout 65a. An upper end surface of the lower annular cover 66 is in contact with a lower surface of the flange portion 62c via an O-ring 75, and a lower end surface of the lower annular cover 66 is in contact with an upper surface of the table support 69 via an O-ring 76. Bolts 77 inserted through bolt insertion holes formed in the outer peripheral edge of the outer case 68 are screwed with female screw holes of the table support 69, whereby the upper annular cover 65 and the lower annular cover 66 are fastened together from above and below. This configuration secures the upper and lower annular covers 65, 66 and the flange portion 62c of the cooling jacket 62 from above and below and compresses the O-rings 75, 76 situated above and below the lower annular cover 66, thereby sealing the lower chamber 13. Note that the space surrounded by the cooling jacket 62 and the table support 69 is at the atmospheric pressure.

The focus ring 64 covers an upper surface of the lower disk part 61b of the electrostatic chuck 61 outside the upper disk part 61a in a radial direction of the upper disk part 61a. The substrate K to be placed on the upper-end chuck surface of the upper disk part 61a is positioned at substantially the same height as an upper surface of the focus ring 64.

The upper surface of the jacket body 62a of the cooling jacket 62 is formed to have a large surface roughness so that a minute clearance 80 is formed between the upper surface of the jacket body 62a and the lower surface of the electrostatic chuck 61. On the upper surface of the jacket body 62a, an O-ring 81 or an annular metal seal is disposed inside the circle formed by the plurality of bolts 73 for fixing the electrostatic chuck. By the O-ring 81, the minute clearance 80 is sealed and formed to have a circular shape in planar view. Further, the jacket body 62a has a gas channel network 83 formed in the upper surface thereof, which communicates with a central gas channel 82 formed at the axis O1. The central gas channel 82 communicates with a joint 85 screwed with the bracket 63, via a gas channel 84 formed in the bottom part 62b.

The joint 85 switchably communicates with the vacuum pump 54 and helium gas supply unit 52 of the temperature adjustment system 50 via a gas pipe 86, which serves also as a suction pipe, and a switching valve 87.

The helium gas supply unit 52 communicates with the upper surface (chuck surface) of the upper disk part 61a via a joint 98, which is screwed with the bracket 63, and a gas channel, and is configured to be capable of supplying He gas to the back of the substrate K.

Figure 3:
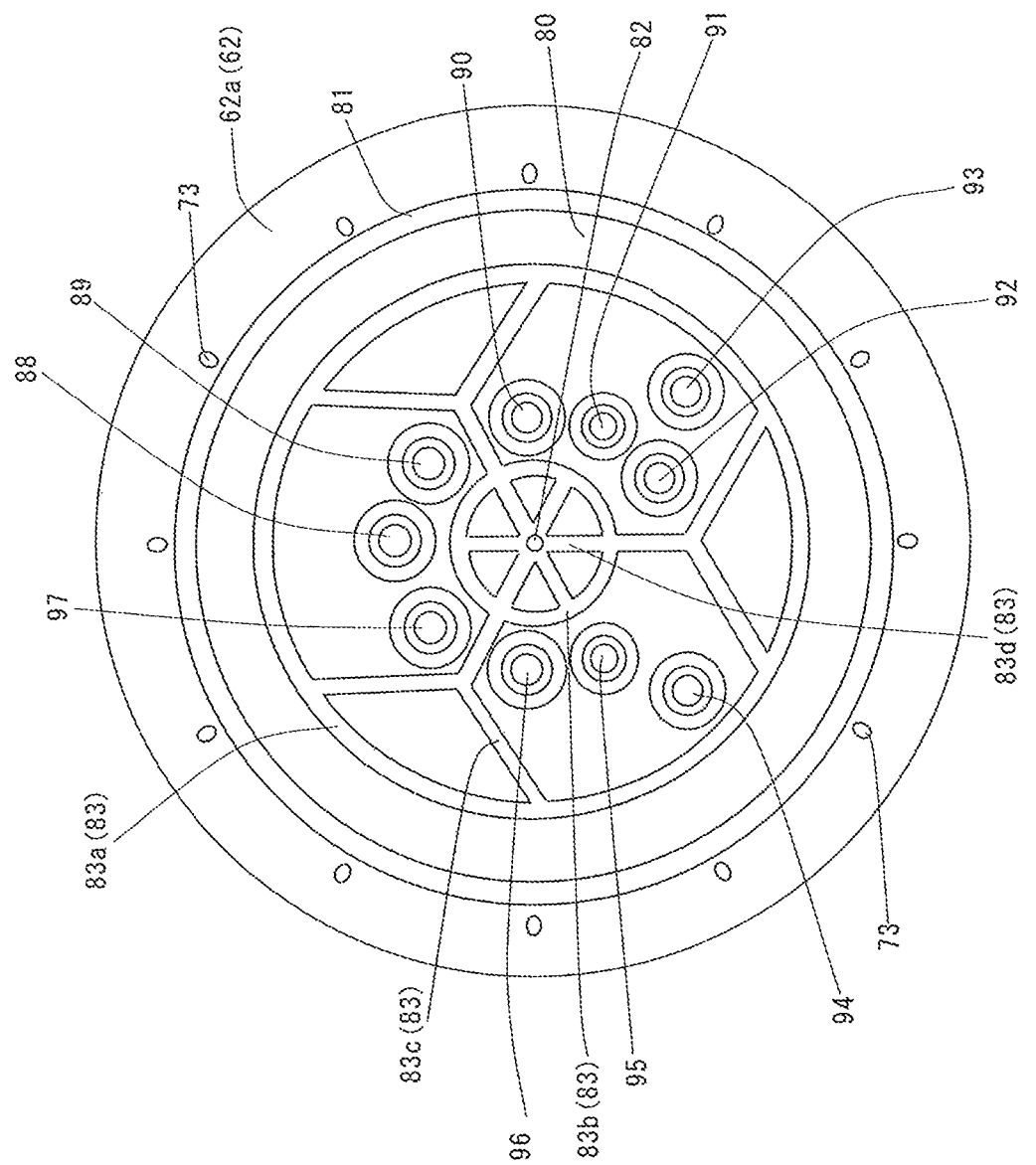
FIG. 3 is a plan view of a cooling jacket shown in FIG. 2.

FIG. 3 is a plan view of the cooling jacket 62 shown in FIG. 2. As shown in FIG. 3, the gas channel network 83 formed within the circular minute clearance 80 surrounded by the O-ring 81 has an outer annular channel 83a, an inner annular channel 83b, Y-shaped channels 83c communicating between the outer annular channels 83a and the inner annular 83b, and channels 83d communicating between the inner annular channel 83b and the central gas channel 82, and is configured to be capable of supplying He gas, which is supplied from the central gas channel 82, uniformly to the entire circular minute clearance 80.

Further, as shown in FIG. 3, the cooling jacket 62 has formed therein a plurality of holes for inserting wires for the power supply units therethrough. Specifically, the cooling jacket 62 has formed therein holes 90, 96 for inserting wires for the electrostatic-cuck power supply unit therethrough, holes 93, 94 for inserting wires for the heater power supply unit therethrough, holes 89, 97 for a temperature monitoring sensor, and a hole 92 for inserting wires for the RF power supply unit applying an RF power to the electrode of the substrate placing table. The cooling jacket 62 also has formed therein holes 88, 91, 95 for the lifter lifting the substrate K from below.

Figure 4:
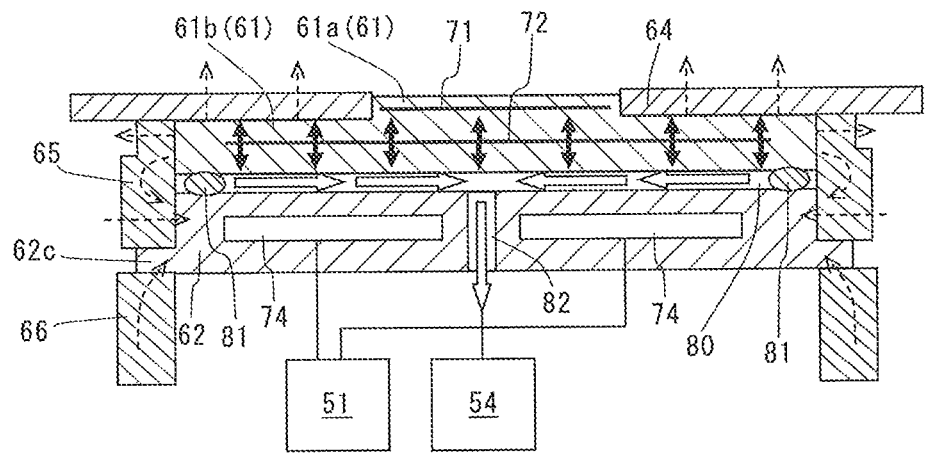
FIG. 4 is a diagram illustrating a function for temperature increasing or idling, wherein a minute clearance is in a vacuum state.
Figure 5:
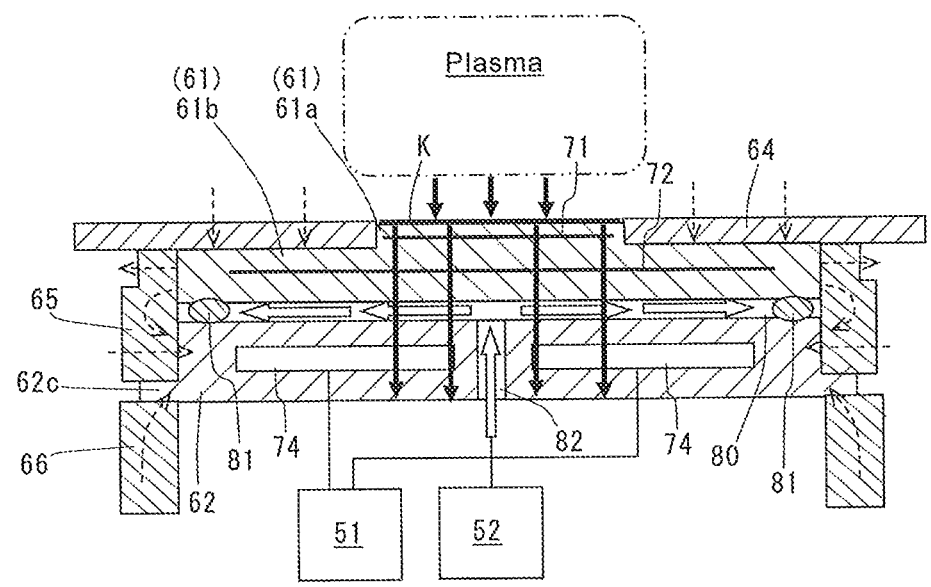
FIG. 5 is a diagram illustrating a function for processing with a substrate on, wherein the minute clearance is in a helium-gas filled state.

FIG. 4 is a diagram illustrating a function for temperature increasing or idling, wherein the minute clearance 80 is in a vacuum state. FIG. 5 is a diagram illustrating a function for processing with the substrate K on, wherein the minute clearance 80 is in an He-gas filled state. Here, FIGS. 4 and 5 show differences in the internal condition of the minute clearance 80, wherein the solid-line arrows represent how heat transfers, the outlined arrows represent how He gas moves, and the broken-line arrows represent how thermal insulation is provided. Note that, while the minute clearance 80 actually has a thickness of several μm to dozens of μm, the minute clearance 80 in the figures is exaggeratedly illustrated. The minute clearance 80 is brought into the vacuum state by connecting the minute clearance 80 to the vacuum pump 54 as shown in FIG. 4 and sucking He gas out of the minute clearance 80. Consequently, the minute clearance 80 serves as a thermal insulation layer so that heat from the heater 72 is prevented from being released to the cooling jacket 62.

On the other hand, when the minute clearance 80 is connected to the helium gas supply unit 52 as shown in FIG. 5, He gas that has excellent heat transfer properties is supplied into the minute clearance 80 and simultaneously the pressure inside the minute clearance 80 is increased, whereby the minute clearance 80 is brought into the He-gas filled state. The He gas transfers heat from the back side of the electrostatic chuck 61 to the surface of the cooling jacket 62. Thereafter, heat is released from the cooling jacket 62 to the outside through the coolant. Thus, heat of the substrate K that is generated during processing quickly passes through the minute clearance 80 and reaches the cooling jacket 62; therefore, heat of the substrate K is quickly removed.

The functions and effects of the substrate placing table 15 and plasma processing apparatus 1 according to this embodiment are described.

In a step before plasma etching, the lifting cylinder 19 shown in FIG. 1 is lowered and a substrate (wafer) K is placed onto the substrate placing table 15 so that it is attracted to and held by the electrostatic chuck 61. In this process, the interior of the chamber 11 is heated to, e.g., a temperature of 120° C., and the substrate K is heated to a temperature of 200° C. by the heater 72 of the electrostatic chuck 61.

In the plasma generating device 30, an RF power is supplied to the coil 31 by the RF power supply unit 32 to generate plasma from $SF_6$ gas, $SiF_4$ gas, $O_2$ gas, and an inert gas that are supplied in the upper chamber 12 from the gas supply device 20. On the other hand, an RF voltage is applied to the electrostatic chuck 61 by the RF power supply unit 35. Consequently, a potential difference is produced between the electrostatic chuck 61 and the plasma existing in the chamber 11. This potential difference causes ions in the plasma to move toward the electrostatic chuck 61, and the ions collide with the surface of the substrate K. Thus, the surface of the substrate K is etched. Note that, while this embodiment uses $SF_6$ gas, $SiF_4$ gas, $O_2$ gas, etc. in generating plasma, various gases, such as, HBr, $Cl_2$, $SF_6$, $O_2$, Ar, and $N_2$, can be used depending on the object to be etched.

In the non-processing mode shown in FIG. 4, during temperature increasing, during which the temperature of the substrate placing table 15 is increased by the heater 72, or during idling, during which the temperature of the substrate placing table 15 is maintained at 200° C., the minute clearance 80 is in the vacuum state because He gas has been sucked out thereof by the vacuum pump 54. The minute clearance 80 serves as a thermal insulation layer to prevent heat from the heater 72 from being released to the cooling jacket 62. Further, the focus ring 64 prevents upward loss of heat. Furthermore, the upper annular cover 65 also prevents loss of heat to the outside. Thereby, heat from the heater 72 is concentrated to the upper disk part 61 that is centrally situated. That is to say, heat of the heater 62 is efficiently concentrated to the upper disk part 61. Therefore, efficient temperature increasing is achieved so that reduced power consumption of the heater 72 is achieved, whereby energy is saved.

In the processing mode shown in FIG. 5, the minute clearance 80 is in the He-gas filled state. During processing, the substrate K generates a large amount of heat and therefore the temperature of the substrate K tends to become higher than a predetermined temperature, i.e., 200° C. However, since the minute clearance 80 is filled with He gas that has excellent heat transfer properties, heat of the substrate K quickly passes though the minute clearance 80 and reaches (is released to) the cooling jacket 62. Therefore, the heat of the substrate K is removed quickly so that the substrate K is cooled. That is to say, the heat of the substrate K is efficiently removed. Further, since the back side of the substrate K is filled with He gas that has excellent heat transfer properties, temperature distribution of the surface of the substrate K is made uniform. Therefore, variations in etching shape, etching rate, and the like which are caused by non-uniform temperature distribution of the surface of the substrate K are suppressed.

In FIG. 2, the entire upper surface of the electrostatic chuck 61, excluding the area where the substrate K is placed, and the entire radial outer surface of the cooling jacket 62 are covered by the focus ring 64 that is made of ceramics and the upper and lower annular covers 65, 66 that are made of ceramics, ceramics having excellent thermal insulation properties. Examples of such ceramics materials include aluminum oxide (alumina), yttria, and quartz. This configuration reduces input of external-disturbance heat into the cooling jacket 62 due to thermal radiation or thermal conduction, thereby preventing the temperature inside the chamber 11 from affecting the interior of the substrate placing table 15. Therefore, temperature adjustment in the substrate placing table 15 is efficiently performed. For example, the temperature of the cooling jacket 62 is easily maintained at approximately 70° C. while the temperature inside the chamber 11 is 120° C. Thereby, a large temperature gradient is formed between the cooling jacket 62 and the electrostatic chuck 62 that is at 200° C., which enables the cooling effect by the cooling jacket 62 to be concentrated to the electrostatic chuck 61 so that increase of the temperature of the substrate K is suppressed. Note that, although the lower surface of the cooling jacket 62 is at the atmospheric pressure, the amount of heat released from the cooling jacket 62 due to convection is very small because the lower surface of the cooling jacket 62 is surrounded by the lower annular cover 66 and the table support 69.

Figure 6:
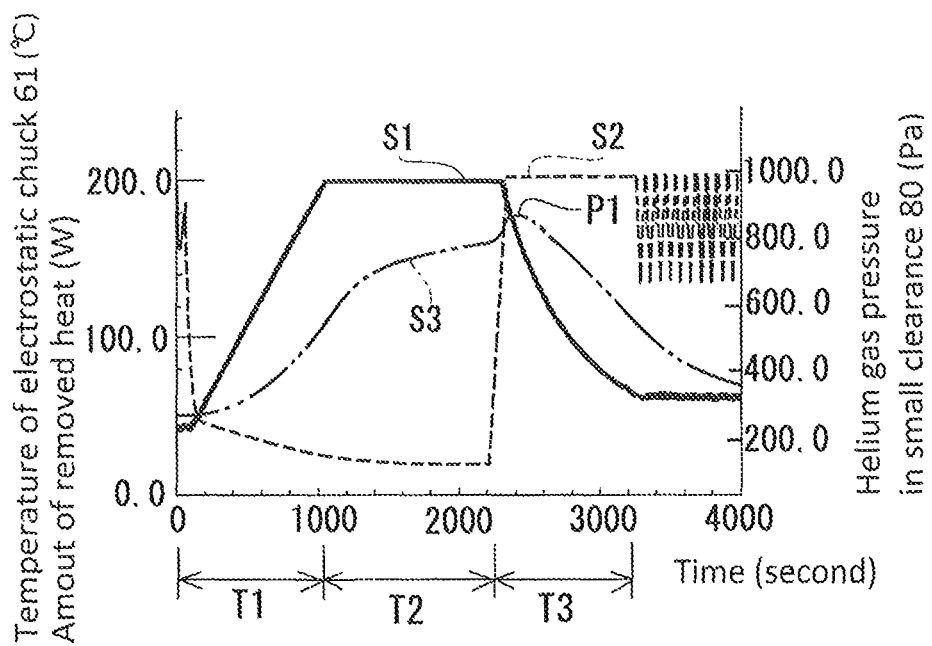
FIG. 6 is a graph showing temporal changes in electrostatic chuck temperature, amount of removed heat, and helium gas pressure in a non-processing mode.

FIG. 6 is a graph showing temporal changes in electrostatic chuck temperature, amount of removed heat, and He gas pressure in the non-processing mode. In FIG. 6, as for a time period in the non-processing mode that starts with a heating step T1 for heating the electrostatic chuck 61 and proceeds to a constant-temperature step T2 for maintaining the temperature of the electrostatic chuck 61 at 200° C. and then to a cooling step T3 for cooling the electrostatic chuck 61 with the cooling jacket 62, the solid-line curve S1 indicates the change in electrostatic chuck temperature (° C.), the broken-line curve S2 indicates the change in He gas pressure (Pa) in the minute clearance 80, and the dashed-and-double-dotted-line curve S3 indicates the change in amount of removed heat (W).

In the heating step T1 and the constant-temperature step T2, the He gas pressure (Pa) in the minute clearance 80 is lowered to a pressure of approximately 100 Pa that is close to absolute vacuum. Therefore, the minute clearance 80 serves as a thermal insulation layer to minimize the amount of heat removed to the cooling jacket 62 in the manner shown in FIG. 4. A test was actually conducted, and the result of the test showed that it took about 17 minutes to increase the temperature of the electrostatic chuck 61 from 50° C. to 200° C. in the heating step T1. In the heating step T1, lowering the He gas pressure (Pa) reduced the amount of removed heat (W).

In the cooling step T3, the heater 72 shown in FIG. 2 is shut off and, as shown in FIG. 6, the minute clearance 80 is brought into the He-gas filled state with a pressure of approximately 1000 Pa. Thereby, the amount of heat (W) removed to the cooling jacket 62 is increased to up to P1.

Figure 7:
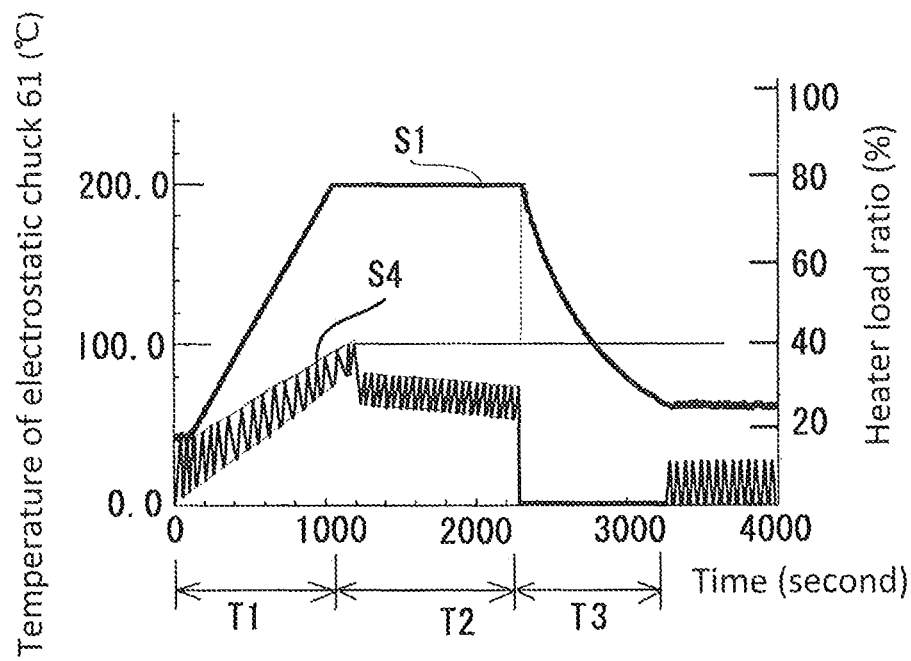
FIG. 7 is a graph showing temporal changes in electrostatic chuck temperature and heater load ratio in the non-processing mode.

FIG. 7 is a graph showing temporal changes in electrostatic chuck temperature and heater load ratio in the non-processing state. Similarly to FIG. 6, FIG. 7 shows changes in electrostatic chuck temperature (° C.) and load ratio (%) of the heater 72 during the time period in the non-processing mode that starts with the heating step T1 and proceeds to the constant-temperature step T2 for maintaining the temperature of the electrostatic chuck 61 at 200° C. and then to the cooling step T3 for cooling the electrostatic chuck 61 with the cooling jacket 62. The solid-line curve S1 indicates the change in electrostatic chuck temperature (° C.), and the solid-line curve S4 indicates the change in load ratio (%) of the heater 72. It is understood that, in the cause of a currently used heater with a maximum power of 1 kW, the maximum load ratio in the heating step T1 is suppressed to about 40%, and therefore the heater 72 may have a reduced capacity.

A brief summary of the effects provided by this embodiment is given below.

(1) In FIG. 2, since the focus ring 64 and the upper and lower annular covers 65, 66 for thermal insulation, which cover the top and radial outer side of the electrostatic chuck 61 and cooling jacket 62, are made of ceramics, external influences, such as the temperature inside the jacket 11, on the electrostatic chuck 61 and the cooling jacket 62 are reduced. This enables efficient temperature control of the electrostatic chuck 61 and the substrate K.

(2) In FIG. 2, since the area where the heater 72 is disposed is set to have a diameter greater than the diameter of the substrate K, temperature distribution on the electrostatic chuck 61 is uniform from the center to the outer peripheral edge of the substrate K.

(3) In FIG. 4, the outward flange portion 62c of the cooling jacket 62 is clamped by and between the upper and lower annular covers 65 and 66 that are made of ceramics, the upper and lower covers 65 and 66 not only serve to thermally insulate the electrostatic chuck 61 and the cooling jacket 62 from the outside but also serve to hold the cooling jacket 62.

(4) The minute clearance 80 that is switchable between the He-gas filled state and the vacuum state is formed at the joint of the lower surface of the electrostatic chuck 61 and the upper surface of the cooling jacket 62. At the times of initial temperature increasing and constant-temperature idling, during which the substrate placing table is in the non-processing mode shown in FIG. 4, the minute clearance 80 is brought into the vacuum state to prevent loss of heat from the electrostatic chuck 61 to the cooling jacket 62; therefore, the initial temperature increasing is efficiently performed and the idling is maintained at a predetermined temperature. On the other hand, at the time of plasma processing, the minute clearance 80 is brought into the He-gas filled state to quickly release heat of the heated substrate K to the cooling jacket 62 through He gas that has excellent heat transfer properties; therefore, the heat is efficiently removed.

(5) Since aluminum nitride that has high thermal conductivity is used as the electrostatic chuck 61, as compared with the case of using aluminum oxide, better temperature distribution is provided which prevents the electrostatic chuck 61 from cracking due to thermal stress.

(6) Further, since the plasma processing apparatus 1 includes the substrate placement table 15 that facilitates temperature control of the substrate K and the electrostatic chuck 61, temperature management during processing of the substrate K is facilitated. Therefore, a non-uniform processing result with poor reproducibility which is caused by unstable or non-uniform wafer temperature is prevented.

Note that, although the lower surface of the electrostatic chuck in this embodiment is directly joined to the cooling jacket, the present invention is not limited thereto. For example, a configuration is possible in which a thermal insulation plate (for example, a quartz plate) having low heat conductivity is disposed between the cooling jacket and the electrostatic chuck so that a minute clearance is formed both between an upper surface of the thermal insulation plate and the lower surface of the electrostatic chuck and between a lower surface of the thermal insulation plate and the upper surface of the cooling jacket. This configuration provides the same effects as the above embodiment.

Note further that, although, as shown in FIGS. 2 and 3, the minute clearance 80 in this embodiment is sealed at the radial outer peripheral edge thereof by an O-ring, the present invention is not limited thereto. For example, a configuration is possible in which the minute clearance 80 is sealed at the radial outer peripheral edge thereof by a heat-resistant metal seal. This configuration also provides the same effects as the above embodiment. Further, the upper annular cover 65 and the lower annular cover 66 in this embodiment are formed separately from each other; however, they may be formed integrally with each other. This configuration also provides the same effects as the above embodiment. Furthermore, although the above embodiment is described with regard to etching, the present invention is not limited thereto and can be used for deposition using a CVD method (chemical vapor deposition method) or the like. Such deposition can involve heat of reaction; therefore, the present invention is particularly effective in the case where accurate temperature control in the range of approximately 100 to 300° C. that is a low-temperature range for deposition is needed.

The above-described embodiments are given by way of example only, and various modifications are possible without departing from the scope of the present invention.

REFERENCE SIGNS LIST

1 Plasma processing apparatus
15 Substrate placing table
50 Temperature adjustment system
52 Helium gas supply unit
54 Vacuum pump
61 Electrostatic chuck
61a Upper disk part
61b Lower disk part
62 Cooling jacket
62c Flange portion
64 Focus ring
65 Upper annular cover
66 Lower annular cover
71 Electrode for electrostatic attraction
72 Heater
74 Coolant flow channel
80 Minute clearance
81 O-ring

The invention claimed is:

1. A substrate placing table electrostatically attracting a substrate to be processed, comprising:
    an electrostatic chuck consisting of an upper disk part and a lower disk part disposed under the upper disk part, the upper disk part having incorporated therein an electrode electrostatically attracting the substrate, the lower disk part having a greater diameter than the upper disk part and having a heater incorporated therein;
    a cooling jacket disposed under the lower disk part and cooling the electrostatic chuck;
    a focus ring disposed outside the upper disk part in a radial direction of the upper disk part and covering an upper surface of the lower disk part, the focus ring being made of ceramics;
    an upper annular cover enclosing the lower disk part and at least a part of the cooling jacket; and
    a lower annular cover clamping the cooling jacket between itself and the upper annular cover,
    the upper annular cover and the lower annular cover being made of ceramics having thermal insulation properties,
    the cooling jacket having an outward flange portion integrally formed on a radial outer peripheral surface thereof; and
    the outward flange portion being clamped from above and below by the upper annular cover and the lower annular cover.

2. The substrate placing table according to claim 1, wherein an area where the heater is disposed has a diameter greater than a diameter of the substrate.

3. The substrate placing table according to claim 1, wherein:
    a minute clearance is formed between the electrostatic chuck and the cooling jacket, the minute clearance extending throughout the area where the heater is disposed, and being sealed from outside; and
    the minute clearance is switchably connected to a helium gas supply and a vacuum pump so that it is switchable between a helium-gas filled state and a vacuum state.

4. The substrate placing table according to claim 1, wherein the electrostatic chuck is made of aluminum nitride.

5. A plasma processing apparatus having the substrate placing table according to claim 1 disposed in a chamber thereof.

6. A plasma processing method performed with a plasma processing apparatus, the plasma processing apparatus including:
- an electrostatic chuck which has an upper disk part and a lower disk part disposed under the upper disk part, the upper disk part having incorporated therein an electrode electrostatically attracting a substrate to be processed, the lower disk part having a greater diameter than the upper disk part and having a heater incorporated therein, and heats the substrate with the heater; and a cooling jacket which is disposed under the lower disk part and cools the electrostatic chuck, wherein a minute clearance sealed from outside is formed between the electrostatic chuck and the cooling jacket, wherein:
- a focus ring enclosing the upper disk part and covering an upper surface of the lower disk part, an upper annular cover having thermal insulation properties and enclosing the lower disk part and at least a part of the cooling jacket, and a lower annular cover having thermal insulation properties and clamping the cooling jacket between itself and the upper annular cover are provided so that heat exchange between the lower disk part and cooling jacket and outside is suppressed by the focus ring, the upper annular cover, and the lower annular cover;
- when the substrate is heated by the heater, the minute clearance between the electrostatic chuck and the cooling jacket is brought into a vacuum state; and
- when the substrate having been heated to a high temperature is etched, the minute clearance between the electrostatic chuck and the cooling jacket is filled with helium gas so as to release heat from the substrate to the cooling jacket to cool the substrate.

* * * * *